(12) United States Patent
Danziger et al.

(10) Patent No.: US 6,900,654 B2
(45) Date of Patent: May 31, 2005

(54) METHOD AND APPARATUS FOR EVALUATING A KNOWN GOOD DIE USING BOTH WIRE BOND AND FLIP-CHIP INTERCONNECTS

(75) Inventors: Steve M Danziger, Manassas, VA (US); Tushar Shah, Columbia, MD (US)

(73) Assignee: BAE Systems - Information & Electronic Warfare Systems, Manassas, VA (US)

( * ) Notice: Subject to any disclaimer, the term of this patent is extended or adjusted under 35 U.S.C. 154(b) by 217 days.

(21) Appl. No.: 09/832,884

(22) Filed: Apr. 12, 2001

(65) Prior Publication Data

US 2001/0031508 A1 Oct. 18, 2001

Related U.S. Application Data

(62) Division of application No. 09/321,565, filed on May 28, 1999, now Pat. No. 6,221,682.

(51) Int. Cl.$^7$ .............................................. G01R 31/26
(52) U.S. Cl. ....................................................... 324/765
(58) Field of Search ........................... 257/48; 324/765; 438/14, 17–18, 613

(56) References Cited

U.S. PATENT DOCUMENTS

| | | |
|---|---|---|
| 3,401,126 A | 9/1968 | Miller et al. |
| 3,429,040 A | 2/1969 | Miller |
| 4,951,098 A | 8/1990 | Albergo et al. |
| 4,975,765 A | 12/1990 | Ackermann et al. |
| 5,047,711 A | 9/1991 | Smith et al. |
| 5,059,899 A | 10/1991 | Farnworth et al. |
| 5,216,278 A | 6/1993 | Lin et al. |
| 5,274,913 A | 1/1994 | Grebe et al. |
| 5,334,857 A | 8/1994 | Mennitt et al. |
| 5,367,763 A | 11/1994 | Lam |
| 5,391,917 A | 2/1995 | Gilmour et al. |
| 5,483,421 A | 1/1996 | Gedney et al. |
| 5,490,040 A | 2/1996 | Gaudenzi et al. |
| 5,490,042 A | 2/1996 | Perkins |
| 5,517,127 A | 5/1996 | Bergeron et al. |
| 5,598,036 A | 1/1997 | Ho |
| 5,623,394 A * | 4/1997 | Sherif et al. ................ 361/705 |
| 5,686,318 A | 11/1997 | Farnworth et al. |
| 5,731,709 A | 3/1998 | Pastore et al. |
| 5,783,868 A | 7/1998 | Galloway |
| 5,796,169 A | 8/1998 | Dockerty et al. |
| 5,886,414 A * | 3/1999 | Galloway ................... 257/784 |
| 6,620,633 B2 * | 9/2003 | Hembree et al. ............. 438/14 |

FOREIGN PATENT DOCUMENTS

JP         10-135281        *  5/1998  ........... H01L/21/60

OTHER PUBLICATIONS

Shaukatullah et al., "Thermal Enhancement of Flip–Chip Packages with Radial–Finger–Contact Spring", May 1995, IEEE 45 th Electronic Components and Technology Conference, pp. 865–871.*
"Solder Ball Size and Uniformity", —http//yoda.ccsm.uiuc.edu/research/ hsieh/size.html, date unknown.
Rates, Jim, "KGD: A State of the Art Report", Advanced Packaging, Feb. 1999, pp. 30, 32.
Yochim, Heidi, "Protecting Bare Die From ESD and Contamination", Advanced Packaging, Feb. 1999, pp. 34, 36.
Goldmann, L.S., "Self–Alighment Capability of Controlled-Collapse Chip Joining," 22nd Electronic Components Conference Proceedings, Washington, D.C., May 1972.
Goldman, L.S., "Geometric Optimization of Controlled Collapse Interconnections", IBM Journal of Research Development, May 1969, pp. 251–265.
Miller, L.F., "Controlled Collapse Reflow Chip Joining", IBM Journal of Research Development, May, 1969, pp. 239–250.
Norris, K.C. et al., "Reliability of Controlled Collapse Interconnections:", IBM Journal Research Development, May 1969, pp. 266–271.
Cavanaugh, D.M., "Thermal Comparison of Flip–Chip Relative to Chip– And–Wire Semiconductor Attachment in Hybrid Circuits: An Experimental Approach," IBM, pp. 214–219, date unknown.

* cited by examiner

Primary Examiner—Evan Pert
(74) Attorney, Agent, or Firm—Ronald R. Snider; Snider & Associates

(57) ABSTRACT

Wire bond pad and solder ball or controlled collapse chip connections C4 are combined on a planar surface of a an integrated circuit device to provide a die. Known good die (KGD) testing is optionally performed using wire bond connections or stress tolerant solder ball connections. The KGD testing is conducted after the integrated circuit dies are diced from a wafer. Solder ball or C4 array connections which withstand thermal stress are used to KGD test the die prior to final use of the wire bond pad connections to an end use device. Alternatively, wire bond pads are used to test the die while maintaining the solder ball or C4 array in a pristine condition for bonding to a final end product device. Both testing with the solder ball C4 array contacts and with the wire bond connections provides metallurgical connections for the KGD test. The solder ball or C4 array is connected to the wire bond pads and either connection can be used to burn-in test the die.

5 Claims, 6 Drawing Sheets

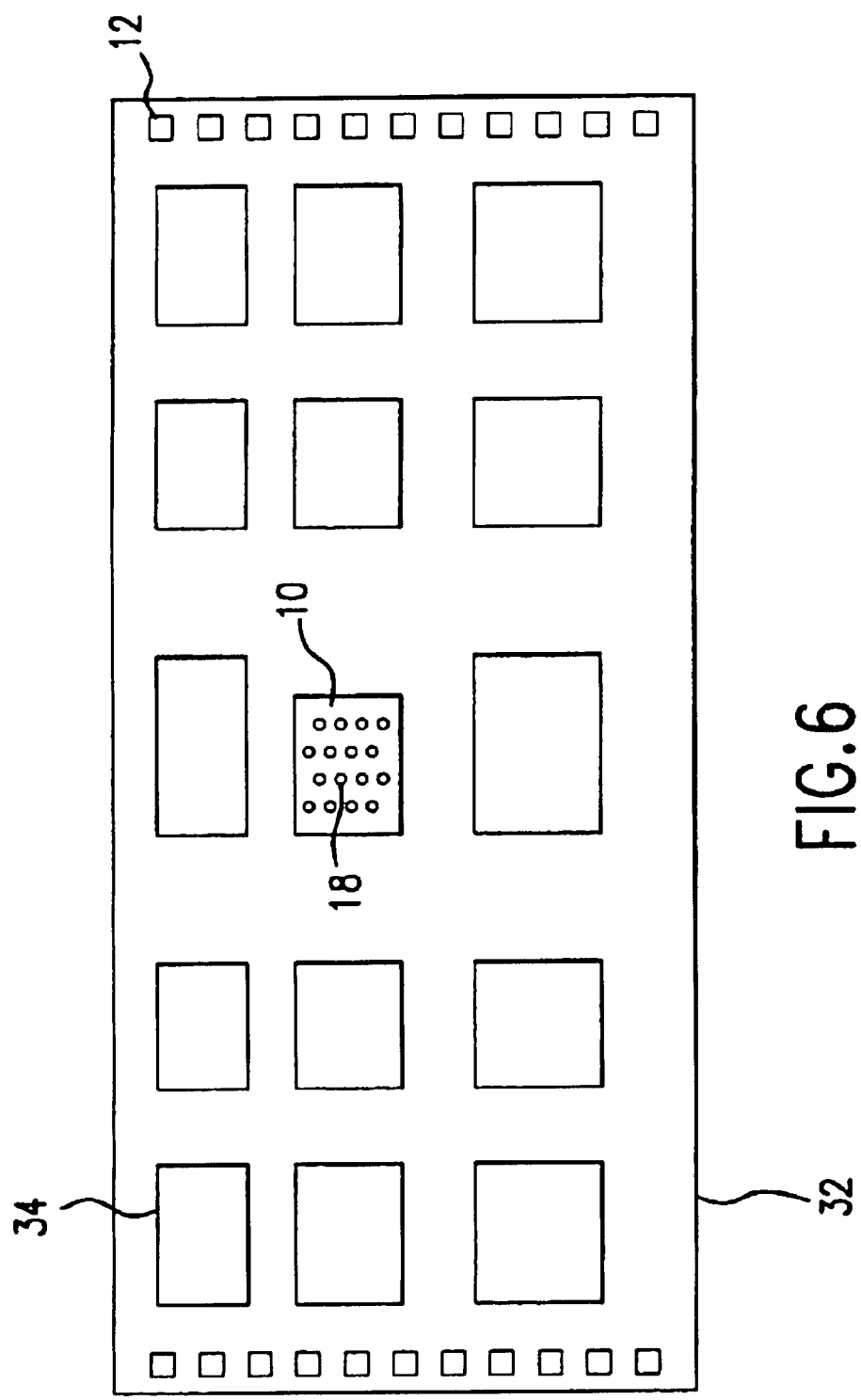

METHOD AND APPARATUS FOR EVALUATING A KNOWN GOOD DIE USING BOTH WIRE BOND AND FLIP-CHIP INTERCONNECTS

This application is a divisional of U.S. patent application Ser. No. 09/321,565 filed May 28, 1999 which is now U.S. Pat. No. 6,221,682.

BACKGROUND OF THE INVENTION

1. Field of the Invention

The present invention relates to known good integrated circuit semiconductor devices in general, and more specifically to improved known good die (KGD) integrated circuit semiconductor devices having metallurgical test only contacts, and metallurgical contacts for providing connections to an end use device. This invention may optionally utilize wire bond technology, flip-chip controlled collapse chip connect technology, here in after C4, solder ball connections and ball grid array technologies.

2. The Prior Art

The description of known good die (KGD) has been described as the equivalent quality and reliability of the comparable packaged part. In essence a "die" is really a chip, but it is only referred to in this way when discussing physical parameters and manufacturing issues. KGD has also been defined as testing beyond conventional wafer probing. As methods for KGD assurance testing have improved, the art has and will continue to seek even better KGD devices. The testing for KGD should succeed as closely as possible to providing evaluation of die performance life span. In production of an improved KGD, not only electrical characteristics of the integrated circuit device, but also mechanical characteristics should be considered. Usually mechanical stresses on the integrated circuit device are produced by thermal stresses and may be taken into account when the integrated circuit device is being tested to determine if it qualifies as a KGD.

If an integrated circuit die, or integrated circuit device is defective prior to incorporation into an end use device such as a multi chip module (MCM) or other device, the result is expensive. The end use device will have to be either scrapped entirely, or reworked by substituting a good integrated circuit at a considerable expense. When many chips or dies are used in a multi chip module, the probability of a bad module increases dramatically as the number of dies increases. In prior art KGD testing of devices where there is no testing for electrical and thermal stress, the probability of a bad die or integrated circuit device is significant when MCM devices with a large number of dies are being made. For this reason, testing for the KGD integrated circuit should be as complete as possible and should address the problem of thermal stress and mechanical stresses as well as electrical problems. When the integrated circuit is installed in the end use device, confidence in its KGD qualification should be as high as possible.

It is known in the art to test integrated circuits having ball-type contacts (control collapse chip connection (C4)) contacts where the die is pressed or forced into a test fixture. The C4 balls are forced into contact with fixture surfaces or edges, which provide contact. Next, the die is tested electrically. However, this approach to limited KGD testing does not provide for a metallurgical bond between the die and the test fixture, and by forcing the die into a position, does not permit the die to naturally respond to conditions of thermal stress. Therefore, force holding of a die in a fixture does not provide the most complete KGD performance life span test. This testing also causes contact between a test fixture and solder balls such as C4 connections, which leaves the balls in a less than pristine condition. Contact with the test fixture can distort the balls, cause scratches, or otherwise change their characteristics which may ultimately effect solderability. The failure to maintain contacts in a pristine condition is a serious problem with this force-contact testing.

Complete burn-in testing is known in the art as a simulated life stress to assure survival of a packaged part. A certain percentage will fail early in their life. The burn-in test involves a temperature and electrical stress to eliminate the weak parts. The complete burn-in testing, however, has been done only at a packaged part level (die/complete device level), not at a KGD, wafer or other lower level prior to incorporation into an end use packaged part device. A KGD test should approach as closely as possible a complete burn-in test of the packaged part, but this is not possible because the packaging step includes untested connections to the KGD.

In prior art devices for testing dies, there has been no die developed which is capable of both KGD test procedures on either wire bond pads or solder ball array contacts, and then use of the remaining set of contacts for connection to an end use device. Therefore, the prior art does not permit manufacture of dies which can be used for either solder ball array connection or wire bond pad connection to an end use device after known good integrated circuit or KGD testing on the alternate set of contacts.

U.S. Pat. No. 5,367,763 to Lam shows a chip or die having solder interconnect pads which are for connection to an end use device or package. Around the periphery of the die are bond pads which are not initially connected to the interconnect pads when the die is first made. Testing is conducted by connecting the interconnect pads to the peripheral bond pads and the peripheral bond pads to test device terminals by a test by a test in a tape by a technique known as tape-automated-bonding. After testing, the leads between the peripheral bond pads and the test device are severed. Connection to an end use device is then made from the interconnect pad through a portion of the test lead with a solder ball or known flip-chip techniques.

It is known in the art to construct dies which are designed for use of a wire bond type pads to test the chip, and then use of tape-automated-bonding (TAB) to install the chip on an end use device. It is also known to use tape automated bonds (TAB) as a test array where after testing, the TAB contacts are severed. The art also has examples of using one set of contacts for testing, wherein the test contacts are subsequently removed from the die prior to installation of the die on an end use device.

One type of electrical and mechanical connection of an integrated circuit chip (die) to a package is called "flip-chip" or "controlled collapse chip connection" (C4) and is described in U.S. Pat. No. 3,401,126, to Lewis F. Miller, et al., and U.S. Pat. No. 3,429,040 to Lewis F. Miller. C4 involves forming solder balls on the surface of the chip that connect signal terminals of the chip with corresponding connections on the package, where the solder balls provide both electrical contact and mechanical support between the chip and the end use device. A disadvantage and difficulty with known C4 interconnections is that they do not allow testing prior to committing the chip to the end use device, other than wafer probe testing which does not allow testing with all the signal terminals metallurgically connected, or more complete KGD testing which can be performed with a soldered bond pad connection. Still further, wafer probe testing of the C4 solder balls undesirably disturbs their pristine condition because of the undesirable probe contact.

U.S. Pat. No. 5,517,127 to Bergeron et al., hereby incorporated by reference, shows the use of controlled collapse chip connection (C4) type solder ball connections in combination with wire bond pads. The C4 technology is used only for non-stress KGD testing the die prior to final connection to an end use device using wire bond technology. The solder balls are located away from the neutral point and will be highly stressed. The reference to C4 therefore does not teach that the connections are laid out and designed for thermal and mechanical stress. Not all C4 contacts are designed for thermal stress and Bergeron et al. is a good example. These C4 connections are not in an array designed for stress tolerance which can withstand thermal stress because they are limited in number and placed away from the chip center.

There is no provision in Bergeron for use of wire bond technology to test a die which will be optionally connected to a an end use device by solder ball C4 array. The test electrical connectors are placed entirely in a plane above the wire bond pads and are not required to be removed after testing of the die. The solder ball test balls protrude above the level of the wire bond pad which allows testing between the die and a test device without affecting the surface of the wire bond pad. The solder balls and the wire bond pads are not on the same planar surface. In another aspect, the disclosure provides that the wire bond die has a wire bond pad disposed at an upper surface of the die. This procedure eliminates probe testing on the wire bond pad and gives metallurgical ball test connections. Wafer dicing may be done before or after testing and there is no need for removal of the added test elements. The subsequent electrical connection, however, is always by wire bond connection.

The testing disclosed in Bergeron cannot withstand more than a few thermal cycles because the stresses will cause breaking of the solder metallurgical joints. The Bergeron type of connections may provide for only 40 joints. In contrast, some stress tolerant solder ball array contacts have up to or more than 400 joints, are located close to the chip center and may be designed for specific thermal stress and mechanical characteristics.

It is also known in the prior art to use redundant C4 connections where one centrally located set is used for the final connection to the end use device, and the other set is used for testing. However, this is not a reliable KGD performance life span alternative, because the C4 array used in testing the final end product has to be mechanically strong as well as electrically correct. The test set of (C)4 connections cannot be used to stress tolerant test an integrated circuit because it will fail within ten cycles because of lack of mechanical strength available for the C4 test connections which are necessarily at the periphery. This is because the stresses increase as on moves out from the center of a C4 array. This heretofore known C4 testing has been used only for electrical testing. Mere use of C4 peripheral balls in place of wire bond pads will not work for KGD testing of a centrally located flip-chip C4 array. The reason is that if only C4 ball contacts are used around the periphery of the chip, instead of pads, these C4 ball contacts will experience very high thermal stress, because they are away from the center contact. Such a peripheral array of balls will quickly deteriorate and break under a few cycles of thermal stress.

In addition to the above discussed prior art, it should be noted that wafer level testing of dies is well known. This type of testing, however, uses probe cards which upon contact with bond pads or solder balls may cause damage to the pads or balls which will effect later bonding to a module or packaging. This type of testing does not provide for a good metallurgical contact and cannot provide a KGD test where thermal and mechanical stress are accounted for at the die, integrated circuit or wafer level.

SUMMARY OF THE INVENTION

A stress tolerant solder ball array is an array of solder ball connections which are formed between an integrated circuit and an end use device as a test device which provide electrical connections and mechanical capability (thermal stress). The stress tolerant solder ball array may be a complete C4 array that is designed for connection to a device which takes into account electrical, thermal stress, and mechanical requirements.

In one embodiment a wafer is first diced into integrated circuit dies, (chips) prior to any testing. The die or integrated circuit is not further diced or cut up into smaller components. This embodiment is directed to obtaining known good dies after dicing and prior to placement of the die on a an end use device. If the die is known to be good, then there is lower loss at the next step of packaging of a plurality of dies such as in a multi chip module (MCM). An increase of module and die through put is provided by improved KGD dies which do not cause expensive loss of many other dies after installation of a bad die. It is an advantage of this invention to test an integrated circuit or die (chip) after the die has been diced from a wafer containing many dies. A purpose of this testing is to obtain known good dies by optionally combining the technologies of the solder ball connection, flip-chip or C4 connection and wire bond pad connection.

The present invention is particularly advantageous for the packaging of multi chip modules (MCM), since the probability that a package contains a defective chip increases with the number of chips contained in the package. Testing to produce improved known good dies prior to packaging afforded by the present inventions reduces the risk that a multiple-chip package will be discarded because of one or more of the dies is defective. Moreover, the small interconnect footprint provided by C4 and other solder ball connection methods allows many dies to be packaged closely together. It is an advantage of this invention to provide known good dies which when used on an MCM with other dies, reduces the number of bad MCM package assemblies produced. This reduces loss of other good dies on the MCM where a bad die is installed.

In another embodiment of this invention, the die is provided with an essentially planar surface which has placed there upon both solder balls or flip-chip C4 array connections to be used for connecting to a test or end use device and wire bonding pads which may be connected to a test or end use device. By placement of both types of connections at approximately the same level, applicant allows for optional testing of the die by testing using the solder ball or flip-chip C4 array contacts or the wire bond pads. This allows production of a single chip which is amenable to either kind of testing, and for subsequent assembly by wire bond connection, or by solder ball or C4 array connection after testing on the complimentary terminals.

It is an advantage of this invention to provide the flip-chip stress tolerant solder ball array and the wire bond contacts on substantially the same level of the chip so that either is accessible during final installation to a packaging module. When the stress tolerant solder ball array contacts are to be the final contacts to the end use device they must touch the end use device before the wire bond contacts.

Flip-chip C4 array or other solder ball array contacts may be connected on an integrated circuit or die surface to the wire bond pads. If it is elected to use the stress tolerant solder ball array contacts for testing, the stress tolerant solder ball array contacts are brought in to engagement with heated solder pads of a test device which may be a substrate or module. The resultant soldered metallurgical connection then is used for the improved KGD test using a stress tolerant solder ball array designed to withstand thermal and mechanical stress anticipated in use with an end use device for evaluation of integrated circuit performance life span. Cyclic temperature testing with stress tolerant solder ball connections gives a more complete test of an integrated circuit or die. Removal of the stress tolerant solder ball array bond is then provided by reheating the test device and the die to a point where the solder begins to flow and the die is lifted off of the test substrate. The die can also be removed by mechanical sheer force. It is an advantage to provide pristine wire bond pad contacts when integrated testing is done with a stress tolerant solder ball connection. After testing utilizing the stress tolerant solder ball array contacts, the integrated circuit die is known to be good, and can be placed upon an end use device substrate utilizing the wire bond pads for final connections. The end use device may also be an MCM device.

It is a further advantage of this invention to provide a die wherein wire bond pad connections may be used for KGD testing, or alternatively stress tolerant solder ball array connections may be used to do a KGD test. Completely redundant wire bond pads and solder ball array connections are provided on a single chip where either may be optionally used for test or for contact to an end use device. If it is desired to obtain a KGD for a flip-chip C4 array or other stress tolerant solder ball array connection to an end use device, testing will be done using wire bond pads. Alternatively, if the die is ultimately to be connected to its end use device by wire bond pads, testing will be conducted by utilizing the stress tolerant solder ball C4 array connections. It is a further advantage to provide a die lay out where the chip is capable of either wire bond connections or solder ball array connections, and where the die customer can elect which is to be used for KGD testing. The invention reduces possible errors prior to a final connection of either the solder ball array connections for wire bond pad connections to the end use device. Another advantage of this invention is to provide an integrated circuit or die manufacturing line and testing line where alternate stress tolerant solder ball array and wire bond pad connections are used to provide a KGD test.

Applicant's invention allows testing of the solder ball array contacts without disturbing the pristine condition of the solder ball array contacts when a wire bond connect to text device is used. This provides an improved KGD or known good integrated circuit, which is a further step forward in the manufacturing process than testing at a wafer level or at the die level with probes and the like.

In another embodiment the integrated circuit may comprise a large wafer segment having a plurality of sub-integrated circuits on its surface. This permits construction of a multi chip module on a single wafer without dicing and reassembling. This invention may also be used with wafer level multi-integrated circuit devices.

Here, a plurality of integrated circuits may be placed on a single wafer, and then the single wafer containing the plurality of integrated circuits is tested as a known good die in accordance with this invention. The wafer then may be incorporated into an end use device without further dicing or cutting into smaller units.

This invention may still further be used with micro-electro-mechanical integrated circuit mechanisms which include silicone based motors. These devices require the use of connections to their end use devices, and should be KGD tested prior to final assembly. Therefore, the principles of this invention utilizing stress tolerant solder ball arrays and wire bond pads for alternately testing a device are applicable. Especially, in the design of motors and mechanical mechanisms, additional mechanical vibrations may be experienced which should be tested for in determining if the device is a KGD. Additional advantages of the invention are set forth in the description which follows, and in part will be obvious from the description, or may be learned by practice of the invention. The advantages of the invention may be further realized and obtained by means of the instrumentalities and combinations, particularly pointed out in the claims.

BRIEF DESCRIPTION OF THE DRAWINGS

FIG. 6 shows an exemplary simplified wafer segment having a plurality of integrated circuits as used in one embodiment of a multi chip module (MCM).

DETAILED DESCRIPTION OF THE PREFERRED EMBODIMENT

Figure 1:
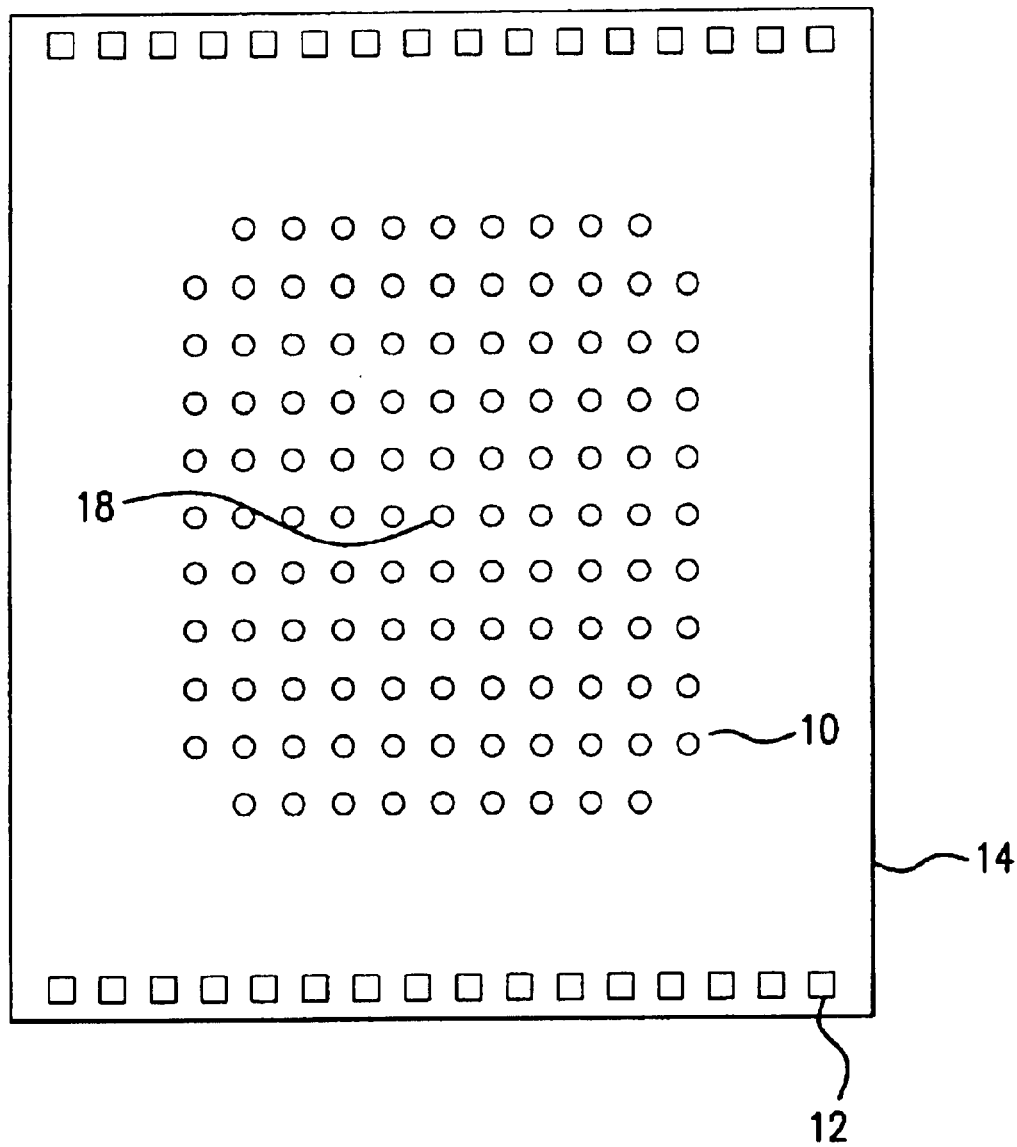
FIG. 1 shows a top view of an exemplary die with flip-chip C4 array contacts in the center, and wire bond pad connections along the upper and lower edges. The connections of FIG. 1 are not intended to depict actual connections which may vary according to design choice and requirements.

In FIG. 1, there is shown a simplified exemplary view of an integrated circuit or die (14) showing connections from the top perspective. Here, a stress tolerant solder ball array of balls (10) are shown in a simplified array, and wire bond pads (12) are shown along the top and bottom edges of a die (14). The stress tolerant balls (10) may be C4 balls which are in an array designed to tolerate thermal stress. Each of the wire bond pads (12) is connected by a discrete conductor (FIGS. 1B, 16) to a stress tolerant solder ball C4 bond ball (10). For simplicity, only one conductor is shown. The conductor (16) is also connected to circuitry of the die (14).

Figure 1A:
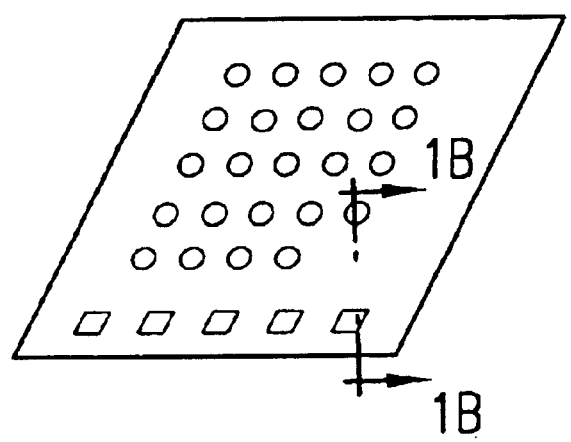
FIG. 1A shows an exemplary die with solder ball array contacts and wire bond pads along one side.
Figure 1B:
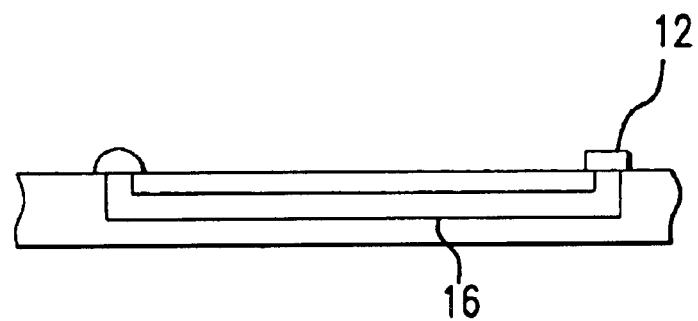
FIG. 1B shows a sectional view of a portion of FIG. 1A which shows a connection between a solder ball and wire bond bad within a die.

FIGS. 1, 1A and 1B are the manufactured die prior to making any connections to either a test device as an end use device.

Figure 4:
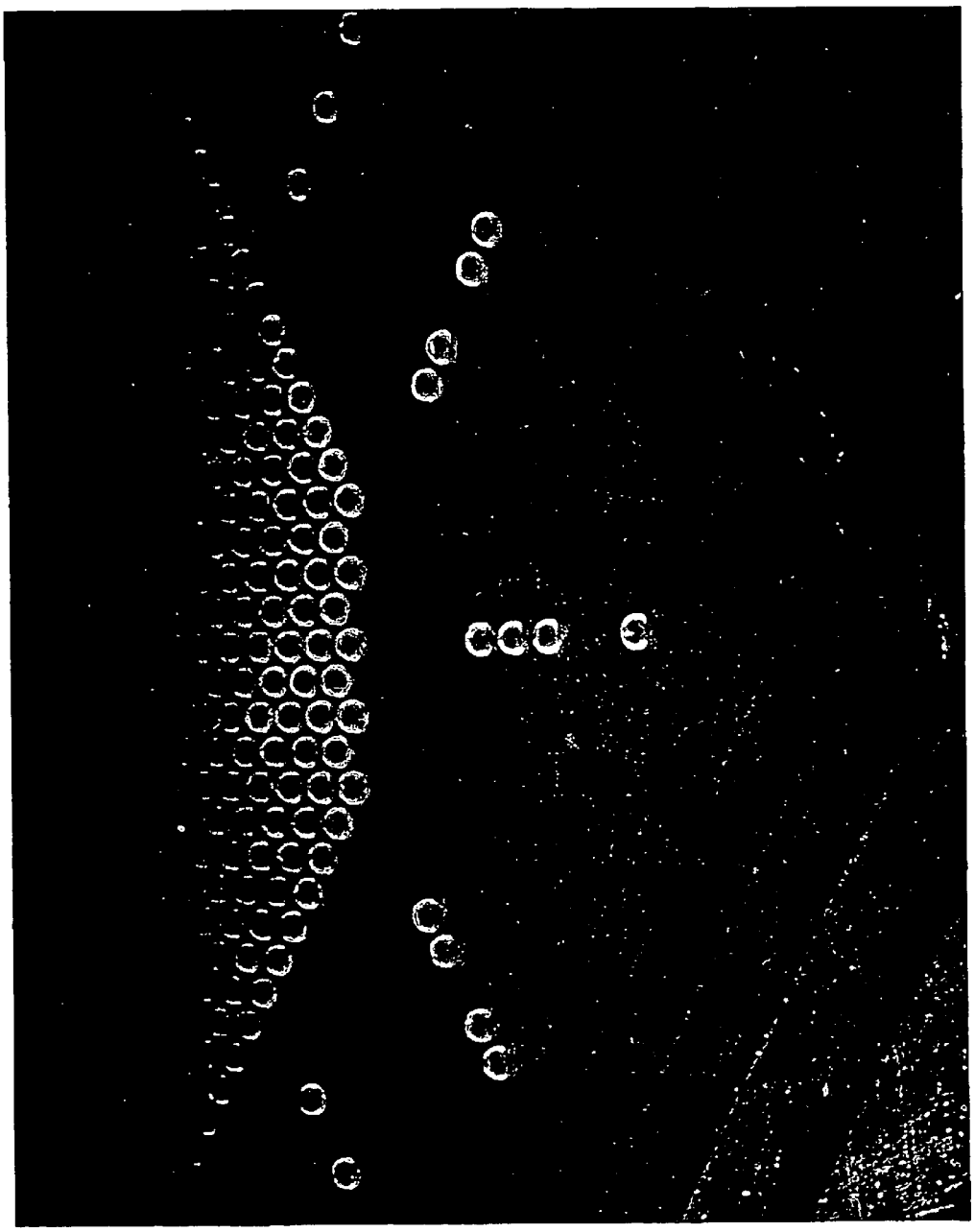
FIG. 4 is a photograph of an exemplary chip showing flip-chip C4 array solder balls and wire bond pads along with conductors connecting wire bond pads to circuitry to which the flip-chip C4 array solder balls are connected.
Figure 5:
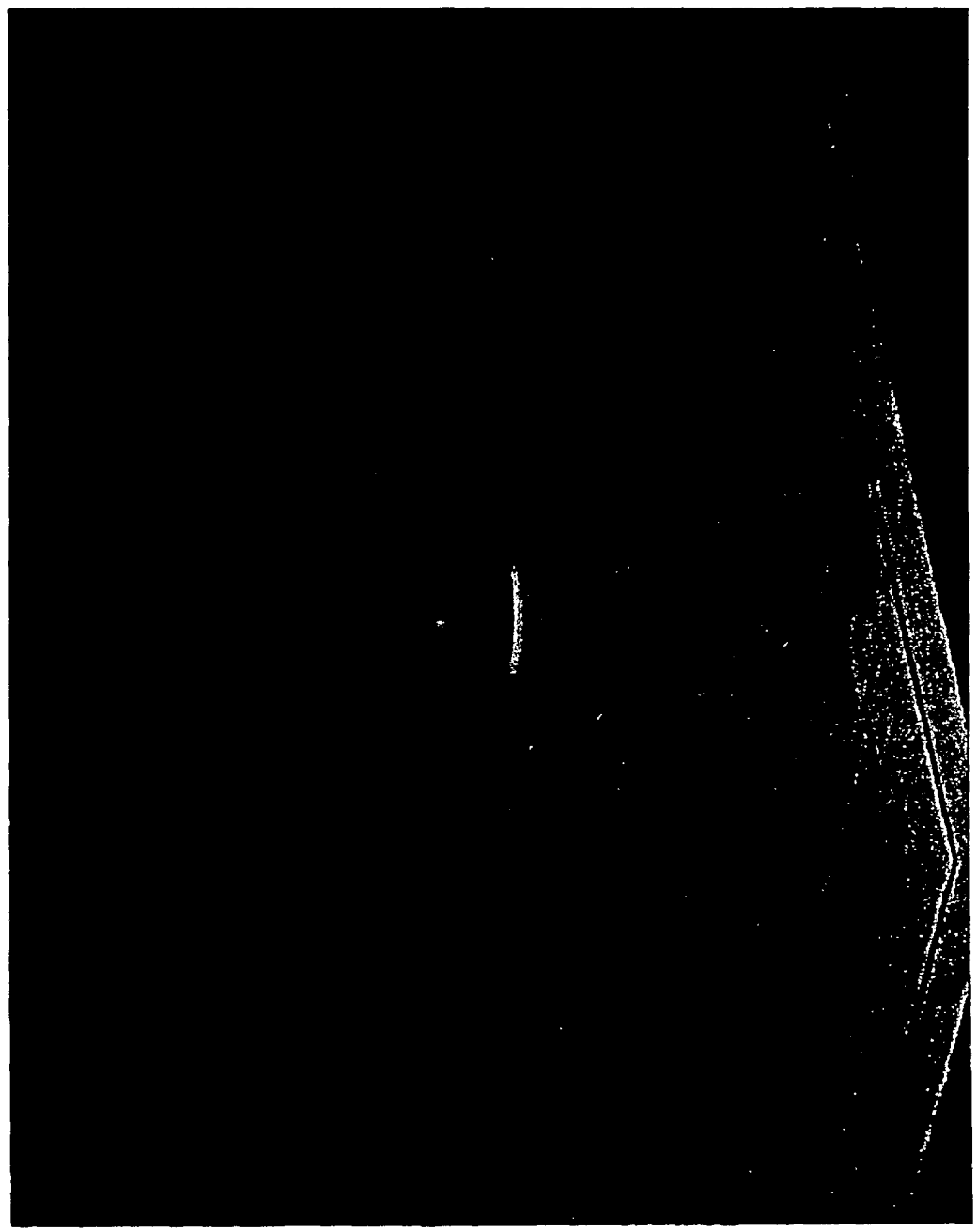
FIG. 5 shows another photographic view of an exemplary solder ball flip-chip C4 array contacts, wire bond pads and connections.

In design of a stress tolerant solder ball array (10) the center contact (18) of the array will not experience stress during thermal change because it is in the center of all of the contacts which are bonded to an end use device or test device. As one moves outwardly from the center contact (18), stresses are known to increase. It is still further known to design the stress tolerant solder ball array (10) so that some ball contacts are used to compensate for thermal stress. This is the practice in design of flip-chip C4 arrays of the type used in this invention. The photographs of FIGS. 4 and 5 show balls which are located radially outwardly from the central cluster of balls which provide for thermal and mechanical stress tolerance. Design considerations for construction of stress tolerant solder ball arrays and stress tolerant C4 arrays are disclosed in U.S. Pat. No. 5,796,169 to Dockerty et al., U.S. Pat. No. 5,490,040 to Gaudenzi et al., U.S. Pat. No. 5,220,200 to Blayton, U.S. Pat. No. 5,598,036 to Ho and U.S. Pat. No. 5,483,421 to Gedney et al., all of which are incorporated her by reference.

In stress tolerant solder ball array or flip-chip C4 array contacts, mechanical and thermal stresses can be compensated for by the many contacts which are provided (up to 400 or more). Stresses are also used to design the balls and for ball placement as described in "Geometric Optimization of Controlled Collapse Interconnections", L. S. Goldman, *IBM Journal of Research Development*, May 1969, pp. 251–265; "Reliability of Controlled Collapse Interconnections", K. C. Norris and A. H. Landzberg, *IBM Journal of Research Development*, May 1969, pp. 266–271; "Thermal Comparison of Flip-Chip Relative to Chip-and-Wire Semiconductor Attachment in Hybrid Circuits: An Experimental Approach", D. M. Cavanaugh, pp. 214–219; which are incorporated herein by reference.

When optional stress tolerant solder ball connections and wire bond pads are used, stress tolerance is determined by the connection to the end use device requirements. Actual configurations which compensate for thermal stress which may be used in accordance with this invention are shown in FIGS. 4 and 5.

The stress tolerant solder ball array (10) is used for testing when wire bond pads (12) will connect to a substrate module. Utilizing stress tolerant solder ball array or flip-chip C4 array contacts to KGD test allows for thermal stress and many cycles of testing required for KGD testing prior to making final contacts between an end use device and wire bond pads (12).

In this invention, the use of the a stress tolerant solder ball array is used to test an integrated circuit which is to be connected to an end use device by wire bond pads. A flip-chip C4 array which has been previously designed for withstanding thermal stress can be used with this invention as a stress tolerant solder ball array.

However, when wire bond pads are used for connecting the integrated circuit to a KGD test device, it is not required that the solder ball or flip-chip C4 contacts are stress tolerant.

Figure 2:
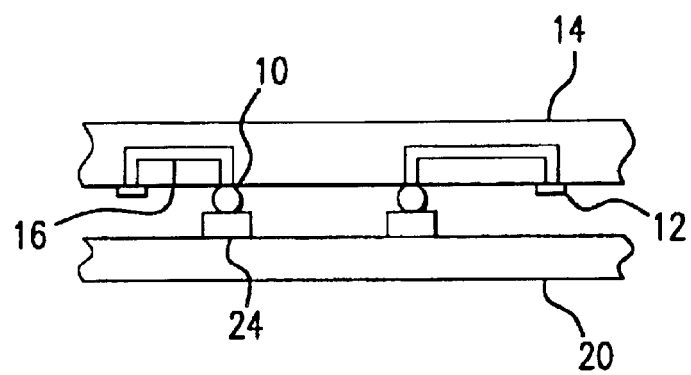
FIG. 2 shows an exemplary simplified wire bond connection where the die has been inverted (flipped) in order to make a flip-chip C4 array bonded connection with a substrate.

FIG. 2 shows the use of flip-chip C4 array contacts to connect a die (14) to a device (20). The device (20) shown in FIG. 2 may optionally be a test device for testing the KGD, or may be the end use device used with the KGD after test. In either case, the connections between the balls (10) and the pads (24) on the device are the same. Also shown in FIG. 2 are conductors (16) which provide the electrical contact between individual pads (12) and individual balls (10). The pads (12) are on the same plane of the die as the balls (10).

Although FIG. 2 is simplified, it should be understood that the balls (10) may be formed in a stress tolerant solder ball array or a flip-chip C4 array as may be used for final installation on an end use device (20) or which are used by an embodiment of this invention to form connections to a KGD test device.

Figure 3:
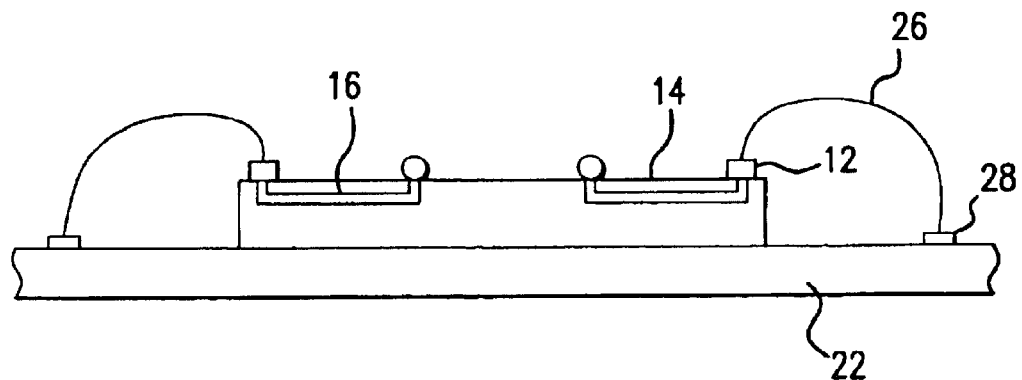
FIG. 3 shows an exemplary simplified die having both wire bonds and flip-chip C4 array contacts wherein the wire bond pads are connected to a substrate.

In FIG. 3 there is shown placement of a die (14) on a device (22) which may optionally be either a test device or an end use device. In either case the connections between pads (12) and the pads (28) are the same. The wire connections (26) are completed after the die, as shown in FIG. 1, is completely manufactured with discrete conductors already formed on the die (14). In the embodiment where device (22) is the end use device, the die will be first be KGD tested after forming metallurgical contacts between the stress tolerant solder ball array or flip-chip C4 array balls as illustrated in FIG. 2. After KGD testing, the die (14) is removed from the test device (20) by melting the solder balls and separating the KGD from the device (20). Then, the die is installed in an end use device, as shown in FIG. 3 by completion of a wire connections (26) between die (14) and end use device (22). In this embodiment, the stress tolerant solder ball connections to the test device provide an improved KGD test.

In another embodiment, when it is desired to use solder ball array or flip-chip C4 array connections as the final contact to an end use device (20), as shown in FIG. 2, then the die (14) is KGD tested on a test device (22), as shown in FIG. 3. Here, wire connections (26) connect pads (12) to pads (28) on the test device (22) and KGD testing is carried out. Next the die (14) is removed from the test device (22) and installed on an end use device (20) as illustrated in FIG. 2. In this embodiment, the stress tolerant capability of the solder ball array is determined by the requirements of connections to the end use device, not by requirements of the KGD test.

An exemplary die is shown the photographs of FIGS. 4 and 5 which can be alternatively used to test the die as a known good die either by a wire bond test described with respect FIG. 3, or by a stress tolerant solder ball or flip-chip C4 array bond test as shown and described in FIG. 2. FIG. 5 is a photograph showing the actual ball and pad structure. FIG. 6 shows the pads (12) and the balls (10) on the same planar surface of a wafer (32).

After KGD testing is done in accordance with a stress tolerant solder ball or stress tolerant flip-chip C4 array contact between the chip (14) and the substrate (20) as shown in FIG. 2, the die (14) is removed from the test substrate (20) by reheating the solder balls (10) and lifting the tested KGD (14) off of the test device (20). This will produce what is called a taffy pull configuration to the solder as it is drawn away. However, this is of no concern, because the contacts between the die (14) and end use device (22), as shown in FIG. 3 will be by the wire bond technique, utilizing wire connections (26) and will not be affected by any distortion in the balls (10). The balls (10) are no longer usable as solder ball or flip-chip C4 array contacts after this KGD test with the stress tolerant solder ball array or flip-chip C4 array, but the die is a high quality KGD and the pads (12) are ready for connection to the an end use device (22), as illustrated in FIG. 3.

The solder balls, used when stress tolerant solder ball array flip-chip C4 array KGD testing of this invention is used, may be heavily leaded solder balls. Ninety-five percent lead and five percent tin have been used. Therefore, upon reheating, the balls soften and there is a sheer right in the middle. It has been found that this technique is very reliable, and that there is no smearing or inadvertent contact from one ball area to another upon removal.

The removal of the solder ball (10) from pad (24) can also be thought of as forming a narrow neck or an hourglass shape which is sheered. This is the taffy pull referred to above and it is known that this does not produce bad dies by solder distortions at the die level after stress tolerant solder ball array or flip-chip C4 array KGD testing.

In FIG. 6 there is shown a segment of a wafer (32) having wire bond pads along the right and left hand edges. In the center of wafer (32) is a cluster of solder balls (10) which are laid out in a square grid surrounding a neutral point (18) of the wafer segment (32). The ball grid may be any size and its size depends only upon the number of connections required and the limitation of a number of connections imposed by spacing from the center (18). Shown on the wafer are a plurality of chips (34) which are interconnected into a multi chip module all on the surface of wafer segment (32). Testing of the wafer segment (32) is either by use of a stress tolerant solder ball array (10), or by use of wire bond pads (12) as described with respect to the embodiments above relating to single known good die production. Although wafer segment (32) contains the plurality of integrated circuits (34), it clearly is definable as an integrated circuit merely having sub-integrated circuits (34) all connected together on the surface of wafer (32).

What is claimed is:

1. An end use device having a known good die (KGD), the KGD having solder ball array and wire bond connections;

the KGD having solder ball array connections on a planar KGD surface;

the KGD having an array of wire bond connections on the planar KGD surface;

the KGD having electrical connections between all of the solder ball array connections and the wire bond connections;

wherein the KGD is a KGD which is thermal stress tolerance tested prior to mounting the KGD on the end use device by a test device connected to the KGD by the wire bond connections or in the alternative by the solder ball connections;

wherein when either the wire bond connections are used or the solder ball connections are used for a known good die test, the other connections are connected to the end use device; and the connections used for the known good die test are not connected to the end use device or any other device, when the KGD is connected to the end use device.

2. The end use device in accordance with claim 1, wherein when either the wire bond connections or solder ball connections is used for the known good die test, the other is not affected by the known good die (KGD) test and remains pristine until connected to the end use device.

3. The end use device in accordance with claim 1, wherein the solder ball array connections or wire bond connections which are used when the die is tested are not removed from the die.

4. The end use device in accordance with claim 1, wherein connections to the test device are metallurgical connections.

5. The end use device in accordance with claim 1, wherein the solder ball array connections are controlled collapse chip connections.

* * * * *

UNITED STATES PATENT AND TRADEMARK OFFICE
CERTIFICATE OF CORRECTION

PATENT NO. : 6,900,654 B2
DATED : May 31, 2005
INVENTOR(S) : Steve M. Danziger and Tushar Shah It is certified that error appears in the above-identified patent and that said Letters Patent is hereby corrected as shown below:

<u>Title page,</u>
Item [73], Assignee, delete "BAE Systems - Information & Electronic Warfare Systems, Manassas, VA" and substitute therefore -- BAE Systems Information and Electronic Systems Integration Inc., Nashua, NH --.

Signed and Sealed this

Eighth Day of November, 2005

JON W. DUDAS
*Director of the United States Patent and Trademark Office*